United States Patent [19]

Hohenwarter

[11] Patent Number: 4,715,189

[45] Date of Patent: Dec. 29, 1987

[54] OPEN CYCLE COOLING OF ELECTRICAL CIRCUITS

[75] Inventor: Gert K. G. Hohenwarter, Tarrytown, N.Y.

[73] Assignee: Hypres, Inc., Elmsford, N.Y.

[21] Appl. No.: 796,842

[22] Filed: Nov. 12, 1985

[51] Int. Cl.⁴ ............................................ F25D 17/02
[52] U.S. Cl. .......................................... 62/64; 62/373
[58] Field of Search ............... 62/62, 514 R, 64, 373; 307/306, 352, 277; 324/158 F, 71.5, 71.6

[56] References Cited

U.S. PATENT DOCUMENTS

| | | | |
|---|---|---|---|
| 1,769,087 | 7/1930 | Vucassovich | 62/64 X |
| 2,261,808 | 11/1941 | Morris | 62/64 |
| 2,470,245 | 5/1949 | Green | 62/64 X |
| 2,988,898 | 6/1961 | Hesson et al. | 62/514 R |
| 3,079,504 | 2/1963 | Hutchens | 62/62 X |
| 3,083,547 | 4/1963 | Stevens et al. | 62/64 X |
| 3,431,749 | 3/1969 | Bounds et al. | 62/64 X |
| 3,894,403 | 7/1975 | Longsworth | 62/55 |
| 4,498,046 | 2/1985 | Faris | 324/158 F |

OTHER PUBLICATIONS

P. Wolf, "Picosecond Sampling with Josephson Junctions," in *Picosecond Electronics and Optoelectronics* (ed. Mourou et al.), pp. 236–243, at 241 (1985).

Hamilton, "High-Speed, Low-Crosstalk Chip Holder for Josephson Integrated Circuits," IEEE Trans. on Instrumentation and Measurement, vol. IM-31, pp. 129–131 (1982).

Hamilton, "Analog Measurement Applications for High-Speed Josephson Switches," IEEE Trans. on Magnetics, vol. MAG-17 (1/81), pp. 577–582.

Air Products & Chemicals, Inc., "Model LT-3-110 Liquid Transfer Heli-Tran Refrigerators—Operating Manual."

*Primary Examiner*—Lloyd L. King
*Attorney, Agent, or Firm*—Kenyon & Kenyon

[57] ABSTRACT

Apparatus and a method are disclosed for cooling a low temperature circuit substrate without the need for a vacuum chamber or total immersion, involving subjecting the circuit to a stream of cold fluid, such as liquid helium, and allowing the fluid thereafter to dissipate into the surrounding environment. The apparatus may include an enclosure for holding the circuit, and means for guiding the fluid onto another portion of the substrate after it strikes the circuit. The exit path for the fluid may fold back past the circuit so as to help convect out heat which enters the vicinity radially from the outside. The circuit may also be cooled indirectly by directing the stream of cold fluid through a thermally conductive block, the block having a small surface thermally connectable to the circuit. Additionally, radiation shields may be placed at desired locations in the apparatus and can be cooled by the waste fluid after it cools the circuit.

10 Claims, 7 Drawing Figures

OPEN CYCLE COOLING OF ELECTRICAL CIRCUITS

BACKGROUND OF THE INVENTION

1. Field of the Invention

The invention relates to apparatus for operating low temperature electronic devices, and more particularly, for cooling such devices to the necessary temperature.

2. Description of Related Art

In order to use superconducting technologies to measure electrical waveforms produced by room temperature devices, or indeed to interface any low temperature electronic device to a room temperature electronic device, an interface scheme must be found which satisfies the electrical, mechanical, and temperature constraints discussed below:

Electrical Constraints.

when operating at high frequencies and extremely short pulse durations, any power lost in the transmission line between the low temperature circuit and the room temperature circuit will degrade the signal transfer. This degradation appears as pulse dispersion or pulse spreading. To minimize loss, the transmission lines should be made of a low resistance material, be as short as possible, and have the largest possible cross sectional area. The latter constraint is limited by the further constraint that the width of the transmission line should not exceed the wavelength of the maximum frequency of interest, because larger conductors will waveguide and cause geometric losses.

Mechanical Constraints.

Since one end of the transmission line will be operating at extremely low temperatures and the other end will be operating at room temperatures, it is important that the transmission line be able to withstand that temperature difference. Thus, the bond between the transmission line and the low temperature device should be able to withstand that low temperature, and the seal through which the transmission line passes between the low temperature volume and the room temperature volume should also be able to withstand the necessary temperatures. These elements should also be able to withstand repeated cycling from room temperature to low temperature for maintenance, replenishment of helium supply, and general everyday use. Additionally, the temperature coefficient of expansion of the transmission lines should closely match that of the low temperature device, and the construction should be such as to permit the apparatus to tolerate vibration and temperature-induced changes in transmission line length (collectively referred to herein as "movement").

Temperature Constraints.

In order to prevent extensive heat transfer from the room temperature volume to the low temperature volume, the transmission lines should be as long as possible. This is directly contrary to the electrical constraints which favor short transmission lines. The transmission lines should also be made of a material which has low thermal conductivity. Since low thermal conductivity usually implies low electrical conductivity, this constraint, too, is contrary to the electrical constraints.

Workers in the field of superconducting electronics typically achieve the necessary temperatures by immersing their circuits in liquid helium. See, for example, Hamilton, "High-Speed, Low-Crosstalk Chip Holder for Josephson Integrated Circuits," IEEE Trans. on Instrumentation and Measurement, Vol. IM-31, pp. 129–131 (1982). The arrangement shown therein involves attaching several coaxial cables to a Josephson Junction chip which is to be immersed in a liquid helium dewar. See also Hamilton et al., IEEE Transactions on Magnetics, Vol. MAG-17, pp. 577–582 (1981), in which a low-temperature chip is inserted partially inside a coaxial line to couple the signals therethrough to the room-temperature devices. Although not mentioned in the reference, it is believed that the low-temperature chip is then immersed in liquid helium. Both arrangements are constrained to have large coaxial lines which have high thermal conductivity. In order to avoid heat losses, the lines are therefore constrained to be long. In addition, these arrangements cannot be adapted easily to planar chips. Furthermore, at least the latter system is constrained to couple only one line to a chip, which limits the system in utility.

An attempt to deal with the constraints described above appears in U.S. Pat. No. 4,498,046 to Faris. The interface described therein includes a pass-through liquid-helium-tight vacuum seal which consists of a flange and two half-cylindrical fused quartz portions, unequal in length, which act as a pass-through plug from a liquid-helium filled cryostat to a vacuum chamber. Fused quartz, while thermally non-conductive, forms a low loss dielectric substrate for conductive copper striplines which are patterned on the flat surface of the longer portion. The coefficient of expansion of fused quartz is small and relatively well matched to that of silicon, which is used for Josephson and semiconductor chip substrates.

The two fused quartz half-cylinder portions of the pass-through plug are arranged so that the portion with the copper striplines extends sufficiently beyond its mating half-cylinder portion on both ends to provide two platforms at opposite ends of the plug. The low temperature semiconductor chip or device is mounted on one of these platforms and the room temperature chip or device is mounted on the other. The cylindrical geometry was chosen in order to minimize stress on cement used to seal the chamber wall around the pass-through. The planar nature of the striplines allows low inductance connections to be made directly to the two chips which are also planar. The low inductance contacts are copper spheres or other rigid probes, about 100 um in diameter or smaller, which penetrate solder pads on the chips when forced into contact by mechanical pressure. The wall of the cryostat is sealed around the pass-through with a thin layer of non-conductive cement. In operation, the two chips are mounted on the platforms and the pass-through is inserted through the cryostat wall such that the low temperature chip is immersed in liquid helium in the cryostat and the room temperature chip is disposed inside the vacuum chamber. A heating element and thermocouple are placed near the position of the room temperature chip in order to warm it. This chamber must be evacuated in order to prevent frosting of water and other gases on the plug, and also to provide adequate insulation for the cryostat.

The '046 apparatus has numerous problems which render it costly, unreliable and impractical to use in most applications. First, the only method described in the '046 patent for cooling the low temperature device involved immersing it in liquid helium. This renders the apparatus bulky and cumbersome.

Second, the apparatus requires at least two seals, one between the cryostat and the vacuum chamber, and one between the vacuum chamber and the external environment. At least the first of these seals is extremely difficult to create, because it must operate at cryogenic temperatures, must be able to be cycled many times between cryogenic and room temperatures, and must be able to withstand a certain amount of vibration without breaking. Due to the small size of the helium atom, it can pass through extremely small cracks in the seal and can even pass through most materials which are not cracked. This severely limits the types of seals which can be used.

Third, since the low temperature chip is fabricated on a silicon substrate and the transmission line is fabricated on a fused quartz substrate, the two elements must usually be made separately and then mechanically and electrically bonded together. These additional steps are costly. In addition, even though their respective temperature coefficients of expansion are close, the mere fact that the materials are different requires some mismatch which degrades the electrical connection and the mechanical reliability of the bond.

Fourth, because multiple sealed layers of chambers and insulating material are required, the transmission line which carries electrical signals between the two chips must be very long.

Fifth, the pass-through of the '046 apparatus has to be cylindrical in order to obtain a good seal. This renders it difficult to manufacture, and requires special geometries such as that shown in FIG. 3E of the '046 patent.

Finally, the chips used in the '046 apparatus cannot be easily plugged in or out in order to change them.

As the above examples suggest, the field of low temperature electronics appears to suffer from a presumption that immersion in liquid helium is the only feasible method of achieving the necessary temperatures. In the field of optics, devices are sometimes cooled using a product known by the trademark Heli-Tran, made by Air Products and Chemicals, Allentown, PA. The Heli-Tran comprises a vacuum enclosed mounting head for holding the sample to be cooled, and a multi-channel flexible transfer tube for connecting the mounting head to a dewar of liquid helium. Although the construction of the transfer tube is not entirely clear, it is believed to comprise a forward helium flow capillary (from the dewar to the mounting head), a shield tube surrounding the forward helium flow capillary, and a separate return flow capillary for the shield fluid. When the dewar is pressurized, liquid helium flows through both the forward helium flow capillary and the shield tube into the mounting head. The helium in the capillary strikes the inside surface of a metal block closing off the end of the transfer tube, then enters a passage coaxially surrounding all the transfer tube elements, travels a short distance in the return direction, and exits through a helium exhaust port. The helium in the shield tube turns back before the metal block, enters the return flow capillary, and exits from a shield flow return port near the dewar. The sample holder is attached to the outside of the metal block, so that it can conduct heat from the sample to be cooled into the metal block, which is itself cooled by the helium in the forward flow capillary.

A primary drawback with the Heli-Tran system is that the mounting head is entirely enclosed in a vacuum shroud, rendering sample demounting difficult and cumbersome. This drawback is accentuated by the large number of small parts associated with the mounting head which must be removed and reinstalled when a sample is replaced. Additionally, with respect to low temperature electronic circuits specifically, the metal block and sample holder are typically much larger than the circuit itself. A significant amount of helium is therefore consumed for cooling thermal mass which does not itself need to be cold. Moreover, the literature teaches total immersion of a superconducting electronic circuit even in combination with the Heli-Tran system or an apparent variation thereof. In U.S. Pat. No. 3,894,403 to Longsworth, FIG. 5, such a system is shown cooling a liquid helium bath in which a superconducting magnet is totally immersed.

Since total immersion structures make little or no effort to limit the immersed surface area, the consumption of liquid helium typically is very large. The present invention derives in part from the observation that the consumption of liquid helium can be significantly reduced if only the region in which the low temperature circuit is located is cooled.

SUMMARY OF THE INVENTION

It is an object of the present invention to provide a method and apparatus for cooling a low temperature circuit.

It is another object of the invention to provide a method and apparatus for cooling such a circuit which does not require enclosure of the circuit in a vacuum chamber.

It is another object of the invention to provide a method and apparatus for cooling such a circuit with reduced liquid helium consumption.

It is another object of the invention to provide a method and apparatus for cooling such a circuit which does not require immersion of the circuit in a bath of liquid helium.

It is another object of the invention to provide a method and apparatus for cooling such a circuit by ejecting a cold fluid onto the circuit and venting waste fluid to the surrounding environment.

The above objects and others are achieved according to the invention by directing a stream of cold fluid onto the region of the chip substrate which contains the low temperature circuit, and subsequently allowing the fluid to disipate into the surrounding environment. The apparatus may include an enclosure for holding the circuit, means for guiding the fluid onto another portion of the substrate after it strikes the circuit, and/or means for directing the exit flow of the fluid so as to cool a radiation shield which surrounds the circuit. The exit path for the fluid may also fold back past the circuit so as to help convect out heat which enters the vicinity radially from the outside. The circruit may be cooled directly by directing the stream of cold fluid onto the circuit itself, or indirectly by dirercting the stream of cold fluid through a thermally conductive block, the block having a small surface thermally connectable to the circuit.

BRIEF DESCRIPTION OF THE DRAWINGS

The invention will be described with respect to particular embodiments thereof. Reference may be made to the drawings, in which like elements are designated by like numerals, and in which FIGS. 1–7 schematically depict cross-sectional views of various embodiments of the present invention.

DETAILED DESCRIPTION

Figure 1:
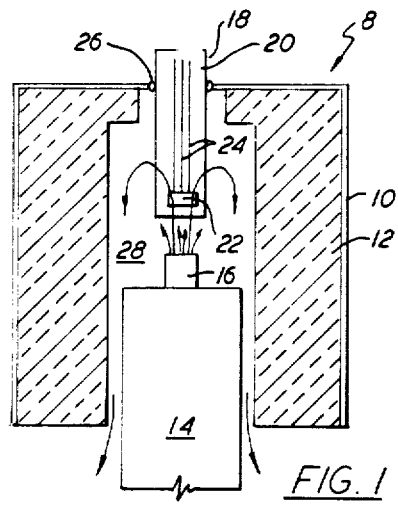

In FIG. 1 there is shown an apparatus constructed according to the invention. A chip holder assembly 8 comprises a rigid frame 10 in the shape of an inverted cup, the interior of which forms an open chamber 28 lined with insulation 12 such as teflon or styrofoam. A transfer tube 14 is connected to a dewar (not shown) of cold fluid, such as liquid helium, and the inside surface of the insulation 12 is shaped so as to loosely fit over the free end of the transfer tube 14. The transfer tube 14 is made up of two coaxial portions, the inside portion for carrying the cold fluid and the outside portion for insulating the inside portion. The free end of the inside coaxial portion forms a nozzle 16 which need not be any particular shape, and may be merely the cut off end of the tube. A slit is cut into the end of the frame 10 and insulation 12 and a chip 18 is partially inserted therein. The chip 18 consists of a substrate 20 which may be made of fused quartz; a low temperature circuit 22 is fabricated in a known manner on the substrate at the end thereof which is inside the cup; and transmission lines 24 extending from the circuit 22 longitudinally on the substrate 20 to the outside of the cup. The low temperature circuit 22 may be a niobium-based Josephson junction circuit and the transmission lines 24 may also be fabricated with niobium. Fused quartz is chosen for the substrate material because of its low thermal conductivity. If desired, the slit in the end of the frame 10 may be sealed around the chip 18 with a bead 26 of glue.

When the liquid helium flow is turned on, a cold liquid-gas mixture is ejected from the nozzle 16 and fills the open chamber 28. The low temperature circuit 22 is thereby cooled to cryogenic temperatures within a matter of seconds. The chip holder 8 should be oriented so that fluid ejected from the nozzle 16 will strike the chip 18 end-on, but exact alignment is not critical. The apparatus should operate successfully even if the stream of fluid misses the chip, as long as venting of the waste fluid is sufficiently slow to cause backed-up fluid to make thermal contact therewith. Waste gas leaves the chamber 28 through a space between the transfer tube 14 and the insulation 12. A second circuit (not shown), operable at a different temperature such as room temperature, may be fabricated directly on the portion of the substrate 20 which is outside the frame 10, or may be connected to the transmission lines 24 via wires (not shown) bonded thereto.

The advantages of this construction are apparent. First, the apparatus is extremely easy and inexpensive to construct, and its small size permits the use of short transmission lines. No critical seals are required because the entire apparatus can be operated in open air without a vacuum shroud. Additionally, since the radiative area of the sample being cooled is so small, the consumption of liquid helium over that of prior art methods is significantly reduced. Finally, the sample is easily demountable by replacing the chip in the chip holder assembly or by simply replacing the entire assembly. It should be noted that the abovedescribed apparatus can be used to cool any sample of any shape, whether or not electronic in nature. If the sample extends outside the cooling chamber as does the sample in FIG. 1, however, then it is desirable that the sample have low thermal conductivity.

Figure 2:
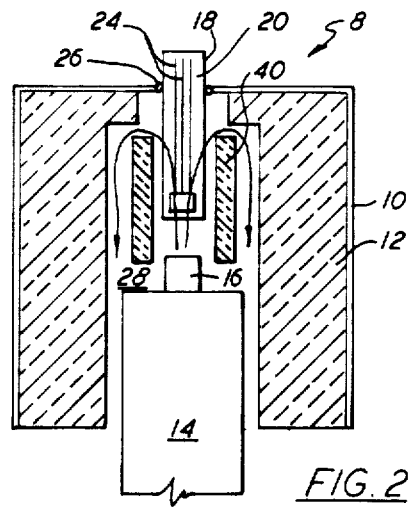

In FIG. 2 there is shown another embodiment of the present invention similar to that shown in FIG. 1 wherein a cylindrical guide 40, which may be made of an insulating material, has been inserted in the chamber 28 around the chip 18. The guide 40 is so disposed as to help direct the flow of fluid from the nozzle 16 onto the circuit 22, and to keep the fluid in thermal contact with other parts of the chip 18 after it cools the circuit. This helps reduce heat conduction along the length of the substrate 20. The guide 40 is spaced from the inside wall of the insulation 12, so that fluid which emerges from the nozzle 16 can flow over the top of the guide and out of the chamber 28 by passing through the space between the guide 40 and the insulation 12 and then between the transfer tube 14 and the insulation 12. The guide 40 is held in place by means (not shown) which permits such flow of the fluid. The addition of the guide 40 provides the additional advantage that waste fluid, as it folds back past the circuit 22, helps convect out of the chamber 28 heat which has penetrated the insulation 12 radially from the external environment. Moreover, the guide 40 or the inside surface of insulation 12 may be made of or coated with a material to act as a radiation shield. In that case the waste fluid will help cool the shield and make its operation more effective.

Figure 3:
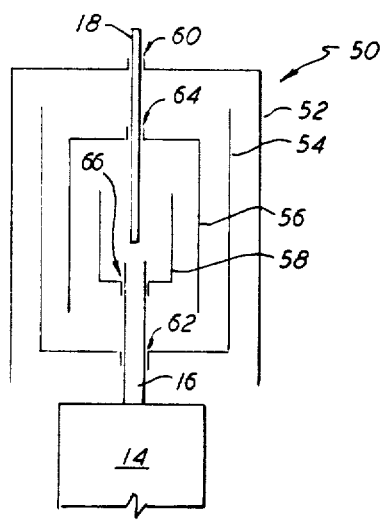

An embodiment of the present invention which capitalizes on the latter feature is shown in FIG. 3. A labyrinth 50 is constructed with a series of four alternately inverted cups 52, 54, 56 and 58, concentrically disposed. That is, the outer cup 52 of the labyrinth 50 opens downward; the next inner cup 54 is disposed coaxially with and inside cup 52 and opens upward; the next cup 56 is disposed coaxially with and inside cup 54 and opens downward; and the innermost cup 58 is disposed coaxially with and inside the cup 56 and opens upward.

Although the terms upward and downward are used in this description, it will be understood that the labyrinth 50 will operate in any orientation, including horizontally. Also, although four cups have been shown in the figure, it will be understood that any number of cups may be used.

The rim and walls of each cup are spaced from the floor and walls, respectively, of each adjacent cup, so as to provide a convoluted passage from the interior of the inside cup 58 to the external environment. The floors of the two downward opening cups 52 and 56 contain slits 60 and 64, respectively. The chip 18 is inserted through the slits 60 and 64 so that the end on which the low temperature circuit is fabricated is disposed inside the cup 58, and the opposite end of the chip 18 is disposed outside the labyrinth 50. The two upward opening cups 54 and 58 also contain holes in their floors, which holes are designated 62 and 66, respectively. The nozzle 16 passes through the holes 62 and 66 so as to open into the inside of cup 58. As in previously described embodiments, the nozzle 16 and the chip 18 should be oriented so that fluid ejected from the nozzle 16 will strike the chip 18 end-on, but alignment is not critical.

In operation, a cold fluid ejected from the nozzle 16 will strike the end of the chip 18 and cool it quickly to cryogenic temperatures. Because of the torturous nature of the path from the inside of cup 58 to the external environment, greater fluid pressure may be required to maintain the desired temperatures near the chip 18. Much of the heat which enters the labyrinth 50 radially, however, will be largely convected out of each successive layer by the moving fluid. The cups 52, 54, 56 and 58 may be made of any material, but a rigid, thermally resistive material such as teflon is preferred. Construction is extremely simple and inexpensive, and the labyrinth 50 may be made as small as desired.

Figure 4:
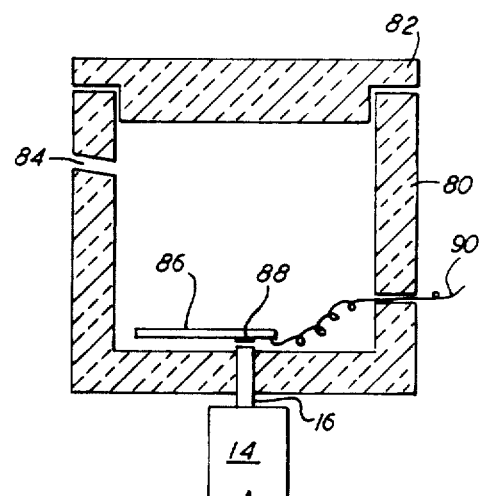

The principle of the present invention may also be used in accordance with the embodiment shown in FIG. 4. In this embodiment, a cover 82 rests on top of an upright styrofoam cup 80. The styrofoam cup 80 has a vent hole 84 in its wall, near the cover 82, for venting waste cooling fluid. The liquid helium transfer tube 14 is disposed beneath the cup 80, the nozzle 16 passing through the floor of the cup 80 and opening vertically upward into the interior thereof. Held horizontally in place above the nozzle 16 by means not shown is a quartz wafer 86, on the underside of which a low temperature circuit 88 is fabricated. The low temperature circuit 88 is extremely small, and only that portion of the wafer need be disposed above the nozzle 16. Connection wires 90 are bonded to the wafer, making electrical connection with the low temperature circuit 88, and pass through the wall of the cup 80 to the external environment. When liquid helium flows through the transfer tube 14, it quickly cools the low temperature circuit 88 to cryogenic temperatures. Waste fluid forms a cloud inside the cup 80, reducing heat pickup through the walls of the cup 80 from the external environment, and then exits the cup 80 through the vent 84.

The embodiment in FIG. 4 is especially useful for wafer probing, which involves testing of a low temperature circuit fabricated with many others on the same substrate, later to be cut apart. It should be noted that the embodiment will also operate successfully if the wafer 86 is inverted, i.e., with the low temperature circuits located on the top side thereof, if the quartz substrate is thin enough. Additionally, and this is applicable to many embodiments, if the low temperature circuit 88 is a type which does not require temperatures as low as that obtainable through direct bombardment with liquid helium, somewhat higher temperatures may be obtained by pulsing the helium supply or by supplying helium at reduced flow rates. Under such circumstances it is advisable to insert a block having some thermal mass between the nozzle 16 and the wafer 86 to help stabilize the temperature.

Figure 5:
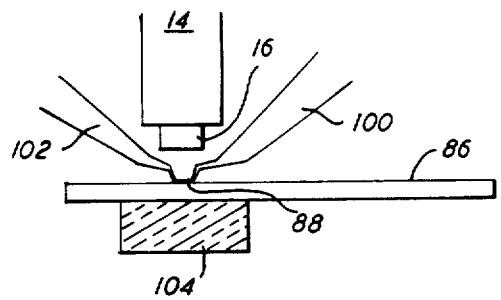

The embodiment shown in FIG. 5 is also useful for wafer probing. In this embodiment, the liquid helium from the transfer tube 14 strikes the low temperature circuit 88 from above, and probes 100 and 102 make electrical contact with connection pads (not shown) on the circuit. A styrofoam disc 104 may be pressed up against the underside of the wafer 86 to help insulate the circuit 88. Alternatively, another transfer tube such as 14 may direct liquid helium to the underside of the wafer 86 under the circuit 88 in place of the styrofoam disc 104.

If the apparatus (or indeed any apparatus made in accordance with the invention) is disposed in ordinary air, the extreme cold of the liquid helium will cause ice to build up around the nozzle. Such ice consists mostly of $O_2$, $CO_2$ and $N_2$. This is not necessarily detrimental, because the ice acts as an insulator. It also evaporates within a short time after the liquid helium is turned off. If desired, however, the ice may be prevented by enclosing the entire apparatus in a container which is effectively closed on its top and sides but contains openings below the level of the circuit. In this way gaseous helium will be caught in the container, gradually filling it from top to bottom until the gases which would otherwise freeze have all been forced out the bottom openings.

Figure 6:
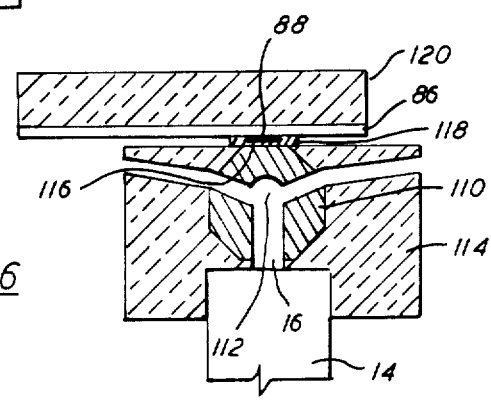

FIG. 6 shows an embodiment of the present invention in which a low temperature circuit is indirectly, rather than directly, cooled by flowing liquid helium. In this embodiment, an aluminum block 110 having a number of channels 112 drilled therethrough is fitted over the end of the nozzle 16. The channels 112 are oriented in such a manner that liquid helium ejected from the nozzle 16 will be directed through the channels 112 and will cool the block 110 relatively evenly. The block 110 and the end of transfer tube 14 may be surrounded by an insulator such as styrofoam block 114, in which case the channels 112 continue through the styrofoam to the external environment. The aluminum block 110 has an exposed flat surface 116 which is slightly larger than the low temperature circuit 88 to be cooled. The smaller this surface, the less liquid helium will be expended to cool regions of the sample which do not need to be maintained at such low temperatures. On the other hand, the surface 116 may be made slightly larger than the circuit 88 to aid in alignment and also to help draw off heat being conducted along the substrate before it reaches the circuit. The wafer 86 with the low temperature circuit 88 on its underside is pressed against the surface 116 so that the low temperature circuit 88 is in thermal communication therewith. Heat sink compound 118 may be used to improve this connection. As in previously described embodiments, the wafer 86 may be backed by a styrofoam block 120.

Figure 7:
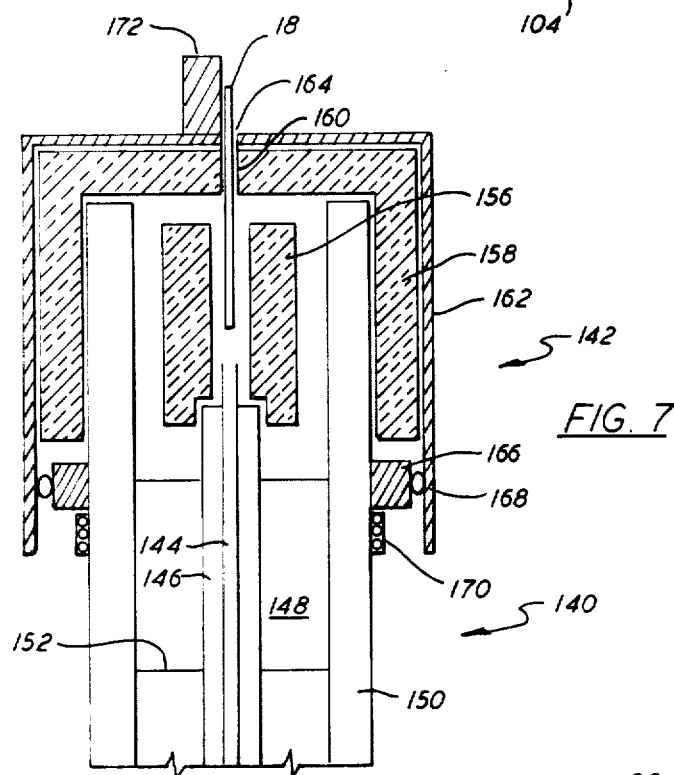

FIG. 7 shows a coolant transfer line, designated generally as 140, which terminates in a mounting head, designated generally as 142, all in accordance with the present invention. The transfer line 140 is quadaxial, consisting of a coolant flow conduit 144 (referred to herein as a capillary) in the center, surrounded by an inner vacuum jacket 146, surrounded in turn by an annular coolant return passage 148, all enclosed in an outer vacuum jacket 150. The coolant flow capillary 144 extends slightly beyond the end of inner vacuum jacket 146, and the outer vacuum jacket 150 extends significantly beyond the capillary 144. Spacers 152 are disposed in the coolant return passage 148 to maintain a relatively constant spacing between the vacuum jackets 146 and 150 without blocking coolant return flow. At the opposite end of the transfer line 140, not shown, a capillary connects the two vacuum jackets 146 and 150 together and a valved port is provided for connection to an external vacuum pump.

A styrofoam guide cylinder 156, similiar to the guide 40 in FIG. 2, is disposed coaxially with and attached to the end of the capillary 144 and inner vacuum jacket 146. The inside surface of the end of the guide 156 adjacent to the capillary 144 and jacket 146 is stepped, so that the end of the guide 156 is wide enough to fit over the vacuum jacket 146 but the remainder of the guide 156 is wide enough to fit over only the capillary 144. The capillary 144 extends a short distance inside the guide 156, and the guide 156 is short enough that it terminates short of the end of the outer vacuum jacket 150.

Fitted tightly over the end of the transfer line 140, and outside the outer vacuum jacket 150, is a styrofoam cap 158 with a slit 160 in its end. A metal cap 162 with its own slit 164, alignable with the slit 160 in the styrofoam cap, is adapted to fit over the styrofoam cap 158. The walls of the styrofoam cap 158 extend down beyond the lower end of the guide cylinder 156, encircling it along its entire length, and the walls of the metal cap 162 extend farther down still. In the annular space formed between the outer vacuum jacket 150 and the walls of the metal cap 162, and below the end of the styrofoam cap 158, there is metal ring 166 attached to the vacuum jacket 150 and encircled by a compressible O-ring 168. This structure helps seal the end of the transfer line 140 when the metal cap 162 is in place. A small heater coil 170 encircles the outside of the transfer line 140 below the ring 166 in order to prevent icing outside the mounting head 142. The slits 160 and 164 in the end of the styrofoam cap 158 and the metal cap 162, respectively, are alignable and adapted to accept the chip 18 discussed previously. The chip 18 is shown in FIG. 7 in edge view only, inserted in the slits and disposed such that its low temperature end is inside the guide cylinder 156 and its room temperature end is exposed outside the mounting head 142. The room temperature end is mounted on one face of a small metal block 172 attached to the outside of the metal cap 162 adjacent to the slit 164. The slit 164 may also be sealed around the chip 18.

In use, the styrofoam cap 158 remains attached to the end of the transfer line 140, and the metal cap 162, the block 172 and the chip 18 form a unit which may be easily removed and interchanged with other units assembled in the same way. Once the unit is in place, the low temperature circuit on the chip 18 may be cooled to cryogenic temperatures within a few seconds by turning on the flow of liquid helium. No vacuum pumping is needed since the vacuum jackets 146 and 150, which never need to be exposed to air, can retain their vacuum for long periods of time.

It should be apparent that the structure of FIG. 7 also takes advantage of the features of FIG. 2 in that waste helium which has done its work on the low temperature circuit near the lower end of the chip 18 is then guided along the surfaces of the chip by the guide 156 where it helps counter heat conduction along the chip from the outside. The waste helium then flows down the outside of the guide 156 and helps convect out heat which has entered the vicinity radially. This process continues down the length of the quadaxial tube 140 to reduce radially directed heating of the helium in the capillary 144. Additionally, the guide 156 and/or the outer wall of the inner vacuum jacket 146 may be made of or coated with a radiation shield which will be cooled by the waste helium. Moreover, since the capillary 144 is so well insulated inside the quadaxial transfer line 140, the line 140 can be made relatively longer in order to reduce heat conduction axially along the various members thereof.

The invention has been described with respect to particular embodiments thereof, and one skilled in the art can now easily ascertain its essential characteristics. Numerous changes and modifications are possible to adapt it to various usages and conditions, all within the scope of the invention. For example, wherever an insulator such as styrofoam is shown, another insulating material or even a vacuum jacket may be used. Radiation shields may be used at various locations in the various embodiments to help reduce liquid helium consumption. Additionally, embodiments of the invention may be disposed on the end of a flexible transfer tube for cold fluid such that it may be used as a probe. This might be useful, for example, in certain biomedical applications where the low temperature circuit comprises a "squid". The person of ordinary skill in the art can easily adapt the principles of the present invention to these and many other situations.

I claim:

1. A method for localized cooling of a device containing a low temperature region, comprising the steps of:
   (a) confining said low temperature region of said device in a housing which is open to the surrounding environment and which permits said low temperature region to be operably connected to a second device disposed outside the housing;
   (b) carrying a cooling fluid from a cooling fluid source and directing a stream of the cooling fluid into the housing in the vicinity of said low temperature region so that the cooling fluid makes thermal contact with said low temperature region; and
   (c) venting the cooling fluid away from the vicinity of said low temperature region of said device and into the surrounding environment.

2. The method according to claim 1, further comprising the step of guiding the cooling fluid into thermal contact with a high temperature region of said device proximal said low temperature region after the cooling fluid makes thermal contact with said low temperature region.

3. Apparatus for cooling a device, comprising:
   (a) an enclosure which at a first end of its length demountably holds said device in such a manner that only a portion of said device to be cooled is disposed within the enclosure, said enclosure being in communication with open air and being configured to permit the portion of said device to be cooled to be operably connected to a second device disposed outside said enclosure; and
   (b) means for carrying a cooling fluid from a ooling fluid source and for directing the cooling fluid into the enclosure toward the portion of said device to be cooled so that the cooling fluid makes thermal contact with the portion of said device to be cooled and then vents into the open air, said means for carrying and directing being adapted to loosely fit within an open section of the enclosure.

4. Apparatus according to claim 3, wherein the means for carrying and directing directs the cooling fluid into the enclosure so as to strike the portion of said device to be cooled.

5. Apparatus according to claim 3, wherein the enclosure further comprises means for defining an exit path for the cooling fluid which folds back past the vicinity of the portion of said device to be cooled at least once before venting the cooling fluid into the open air.

6. Apparatus for cooling a device having a high temperature and a low temperature region, comprising:
   (a) an enclosure which at a first end of its length demountably holds said device in such a manner that only said low temperature region is disposed within the enlosure, said enclosure being in communication with open air and being configured to permit said low temperature region to be operably connected to said high temperature region disposed outside said enclosure; and
   (b) means for carrying a cooling fluid from a cooling fluid source and for directing the cooling fluid into the enclosure toward said low temperature region so that the cooling fluid makes thermal contact with said low temperature region and then dissipates into the open air after contacting said low temperature region, said means for carrying and directing being adapted to loosely fit within an open section of the enclosure.

7. Apparatus according to claim 6, further comprising a thermally conductive block disposed within the enclosure between said low temperature region and the means for carrying and directing and having a first surface which is in thermal contact with said low temperature region and a second surface which is in thermal contact with the cooling fluid delived from the means for carrying and directing.

8. Apparatus for localized cooling of a low temperature region of a device, comprising:
   (a) means for housing said low temperature region in such a manner to permit said low temperature region to be operably connected to a second device disposed outside the means for housing, said means for housing being in communication with open air;
   (b) means for carrying a cooling fluid from a cooling fluid source and for directing the cooling fluid into the means for housing in the vicinity of said low temperature region of said device so that the cooling fluid makes thermal contact with said low temperature region; and
   (c) means for venting the cooling fluid from the vicinity of said low-temperature region of said device to the open air.

9. Apparatus according to claim 8, further comprising means for guiding the cooling fluid into thermal contact with a high temperature region of said device proximal said low temperature region after the cooling fluid makes thermal contact with said low temperature region.

10. Apparatus according to claim 8, further comprising a thermally conductive block disposed within the means for housing between said low temperature region and the means for carrying and directing and having a first surface which is in thermal contact with said low temperature region and a second surface which is in thermal contact with the cooling fluid delivered from the means for carrying and directing.

* * * * *

UNITED STATES PATENT AND TRADEMARK OFFICE
CERTIFICATE OF CORRECTION

PATENT NO. : 4,715,189

DATED : December 29, 1987

INVENTOR(S) : G. HOHENWARTER

It is certified that error appears in the above-identified patent and that said Letters Patent is hereby corrected as shown below:

Column 1, line 19, change "when" to --When--.

Column 4, line 43, change "disipate" to --dissipate--.

Column 4, line 51, change "circruit" to --circuit--.

Column 4, line 53, change "dirercting" to --directing--.

Column 11, line 1, change "delived" to --delivered--.

Signed and Sealed this

Seventh Day of June, 1988

Attest:

DONALD J. QUIGG

*Attesting Officer*   *Commissioner of Patents and Trademarks*